United States Patent
Sundblad et al.

(10) Patent No.: US 9,270,292 B2
(45) Date of Patent: Feb. 23, 2016

(54) EFFICIENT TIME-INTERLEAVED ANALOG-TO-DIGITAL CONVERTER

(71) Applicant: Anacatum Design AB, Linköping (SE)

(72) Inventors: Rolf Sundblad, Ljungsbro (SE); Emil Hjalmarsson, Linköping (SE)

(73) Assignee: ANACATUM DESIGN AB, Linköping (SE)

( * ) Notice: Subject to any disclaimer, the term of this patent is extended or adjusted under 35 U.S.C. 154(b) by 0 days.

(21) Appl. No.: 14/769,945

(22) PCT Filed: Mar. 7, 2014

(86) PCT No.: PCT/EP2014/054469
§ 371 (c)(1),
(2) Date: Aug. 24, 2015

(87) PCT Pub. No.: WO2014/135686
PCT Pub. Date: Sep. 12, 2014

(65) Prior Publication Data
US 2015/0381195 A1    Dec. 31, 2015

Related U.S. Application Data

(60) Provisional application No. 61/774,983, filed on Mar. 8, 2013.

(51) Int. Cl.
*H03M 1/00* (2006.01)
*H03M 1/12* (2006.01)

(52) U.S. Cl.
CPC ............ *H03M 1/1255* (2013.01); *H03M 1/121* (2013.01)

(58) Field of Classification Search
CPC ............ H03M 1/1215; H03M 1/0836; H03M 1/1255; H03M 1/121
USPC .................................................. 341/123, 155
See application file for complete search history.

(56) References Cited

U.S. PATENT DOCUMENTS 7,292,170 B2 * 11/2007 Kinyua ............... H03M 1/0624
341/141
7,961,123 B2 * 6/2011 Nagarajan ........... H03M 1/1057
341/118

(Continued)

FOREIGN PATENT DOCUMENTS

EP          0624289 B1    9/1997
JP          H0645936 A    2/1994

(Continued)

OTHER PUBLICATIONS

PCT International Preliminary Report on Patentability dated Feb. 18, 2015 for PCT International Application No. PCT/EP2014/054467, 6 pages.

(Continued)

Primary Examiner — Khai M Nguyen
(74) Attorney, Agent, or Firm — Remarck Law Group PLC

(57) ABSTRACT

A time-interleaved analog-to-digital converter for conversion of an analog input signal to a digital output signal having a sample rate R comprises an array of N constituent analog-to-digital converters that operate based on an analog-to-digital converter operation clock to provide the digital output signal, N sample-and-hold units connected to the input of a respective constituent analog-to-digital converter that operate based on a respective one of M of timing signals, wherein no timing signal is used to clock two or more of the sample-and-hold units, one or more digital output processing units that provide a sample of the digital output of a constituent analog-to-digital converter as a sample of the digital output signal based on the respective one of the M timing signals, and a timing circuit that generates the analog-to-digital converter operation clock signal, each timing signal having a period of M/R, wherein M is less or equal to N.

16 Claims, 6 Drawing Sheets

(56) References Cited

U.S. PATENT DOCUMENTS

| | | | | |
|---|---|---|---|---|
| 8,310,387 | B2 * | 11/2012 | Harris | H03M 1/0836 341/118 |
| 8,487,795 | B1 * | 7/2013 | Jiang | G11C 27/024 327/415 |
| 8,611,483 | B2 * | 12/2013 | Zhu | H04L 7/0334 341/122 |
| 8,643,428 | B2 * | 2/2014 | Dedic | G11C 27/02 327/415 |
| 2010/0277354 | A1 | 11/2010 | Lee et al. | |
| 2011/0128175 | A1 | 6/2011 | Harris et al. | |
| 2011/0304489 | A1 | 12/2011 | Christer et al. | |

FOREIGN PATENT DOCUMENTS

| | | |
|---|---|---|
| JP | 2011049746 A | 3/2011 |
| WO | 0044099 A1 | 7/2000 |
| WO | 2007093478 A1 | 8/2007 |
| WO | 2010042051 A1 | 4/2010 |
| WO | 2012123578 A1 | 9/2012 |

OTHER PUBLICATIONS

PCT International Preliminary Report on Patentability dated Feb. 9, 2015 for PCT International Application No. PCT/EP2014/054469, 6 pages.

PCT International Search Report dated Aug. 14, 2014 for PCT International Application No. PCT/EP2014/054470, 1 page.

PCT International Search Report dated Jul. 31, 2014 for PCT International Application No. PCT/EP2014/054467, 1 page.

PCT International Search Report dated May 28, 2014 for PCT International Application No. PCT/EP2014/054469, 2 pages.

Van Thillo, W. et al., "A Flexible Antenna Selection Scheme for 60 GHz Multi-Antenna Systems Using Interleaved ADCs," IEEE Communications Society, IEEE ICC 2009 Proceedings, Jun. 14, 2009, 5 pages.

* cited by examiner

EFFICIENT TIME-INTERLEAVED ANALOG-TO-DIGITAL CONVERTER

CROSS-REFERENCE TO RELATED APPLICATIONS

This application is a 371 U.S. National Stage of International Application No. PCT/EP2014/054469, filed Mar. 7, 2014, which claims priority to U.S. Provisional Application No. 61/774,983, filed Mar. 8, 2013. The disclosure of each of the above applications is incorporated herein by reference in their entirety.

TECHNICAL FIELD

The present invention relates generally to the field of analog-to-digital converters. More particularly, it relates to efficiency of a time-interleaved analog-to-digital converter in terms of silicon area and/or energy.

BACKGROUND

Electronic equipment (such as, for example, television sets and other audio/video equipments) are commonly implemented using digital technology instead of analog technology. Typically, the more advanced the digital technology gets the more demanding the task of converting an analog signal to a digital signal suitable for the digital technology implementation becomes.

Conceptually, an analog-to-digital converter (also denoted ADC or A/D converter) is very well know in the art as well as its basic functionality (sample-and-hold, quantization) and will not be elaborated on further herein.

For high sampling frequencies it may be necessary or at least beneficial to use ADC structures comprising several constituent ADC:s to be able to accommodate the high sampling frequency. Such structures alleviate the processing speed requirements on each constituent ADC. Examples of such ADC structures are pipe-lined ADC:s and time-interleaved ADC:s (e.g. parallel successive ADC:s). US 2011/0304489 A1, WO 2007/093478 A1, EP 0624289 B1 and WO 2010/042051 A1 describe various example time-interleaved ADC structures.

In a typical implementation of a time-interleaved ADC (TI ADC) it is desirable to be able to accommodate various sampling frequencies of the digital output signal. On the other hand, it may be very cumbersome to design and verify a constituent ADC design for operation at different clock frequencies. Thus, it would be desirable to be able to use a constituent ADC implementation designed for a particular fixed clock frequency in a TI ADC structure and still enable provision of various sampling frequencies of the digital output signal.

Therefore, there is a need for flexible digital output signal sampling frequency time-interleaved analog-to-digital converters comprising constituent analog-to-digital converters designed for a particular fixed clock frequency.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof.

It is an object of some embodiments to obviate at least some of the above disadvantages and to provide methods and arrangements for operation of a time-interleaved analog-to-digital converter.

According to a first aspect, this is achieved by a method of operating a time-interleaved analog-to-digital converter for conversion of an analog input signal to a digital output signal having a sample rate R.

The time-interleaved analog-to-digital converter comprises an array of an integer number N of constituent analog-to-digital converters each having an analog input and a digital output, an integer number N of sample-and-hold units, each sample-and-hold unit connected to the analog input of a respective one of the N of constituent analog-to-digital converters.

The time-interleaved analog-to-digital converter also comprises a timing circuit for generating an analog-to-digital converter operation clock signal having a period that enables a constituent analog-to-digital converter operating based on the analog-to-digital converter operation clock to digitize an analog signal sample during a time period equal to M/R, and a number M of timing signals each timing signal having a period of M/R, wherein M is less or equal to N.

The method comprises (for each of a number M of the N constituent analog-to-digital converters, wherein each of the M constituent analog-to-digital converters is associated with a corresponding sample-and-hold unit) clocking the corresponding sample-and-hold unit with a respective one of the M timing signals to provide a sample of the analog input signal at the analog input of the constituent analog-to-digital converter. No timing signal is used to clock two or more of the sample-and-hold units.

The method also comprises (for each of the M constituent analog-to-digital converters) operating the constituent analog-to-digital converter based on the analog-to-digital converter operation clock to provide a digital signal at the digital output of the constituent analog-to-digital converter, and providing a sample of the digital signal of the digital output of the constituent analog-to-digital converter as a sample of the digital output signal based on the respective one of the M timing signals.

In some embodiments, the time-interleaved analog-to-digital converter may also comprise a time aligner having N inputs and N outputs, wherein each output is associated with a respective input and each input is connected to the digital output of a respective one of the N of constituent analog-to-digital converters. In these embodiments, providing the sample of the digital signal of the digital output of the constituent analog-to-digital converter as a sample of the digital output signal based on the respective one of the M timing signals may comprise clocking the time aligner with the respective one of the M timing signals, and in response thereto transferring the digital signal from the digital output of the constituent analog-to-digital converter to a corresponding output of the time aligner via a corresponding input of the time aligner. The digital signal of the corresponding output of the time aligner has sample rate R/M.

In some embodiments, the period of the analog-to-digital converter operation clock signal is a fixed parameter (typically determined by a hardware implementation of the constituent analog-to-digital converters). This clock period may, for example, be the same as a system clock period.

According to some embodiments, the sample rate R may be variable. For example, a sample clock signal having clock period 1/R may be generated from the system clock and each of the M timing signals may be an equidistantly time-shifted copy of a clock signal with period M/R (where the time-shift may be zero for one of the timing signals) such that the M timing signals jointly provide the sample clock.

The sampling distance 1/R may be different than the period of the analog-to-digital converter operation clock signal according to some embodiments. Thus, the sampling distance 1/R may be greater than or smaller than the period of the analog-to-digital converter operation clock signal. Alternatively, the sampling distance 1/R may be equal to the period of the analog-to-digital converter operation clock signal in some situations.

According to some embodiments, M may be determined based on the sample rate R and on the time it takes for a constituent analog-to-digital converter to digitize an input signal. For example, a constraint may be that if a constituent analog-to-digital converter can digitize an input signal during a time period T (a constituent analog-to-digital converter latency which corresponds to a certain number of periods of the analog-to-digital converter operation clock signal, the certain number depending on the implementation of the constituent analog-to-digital converter), then M is an integer that satisfies TR being less than or equal to M.

The method may further comprise multiplexing the digital signals of the corresponding outputs of the time aligner to produce the digital output signal.

In some embodiments, the method may further comprise determining M as an integer which satisfies a constituent analog-to-digital converter latency T multiplied by R being smaller than or equal to M. For example, the integer M may be determined as the smallest integer that satisfies T multiplied by R being smaller than or equal to M.

In some embodiments, M may be less than N and the method may further comprise causing constituent analog-to-digital converters that are not among the M constituent analog-to-digital converters to enter a low energy mode. The low energy mode may comprise a complete hindrance of power supply to the relevant constituent analog-to-digital converters or it may comprise a sleep state where some operations may be performed but which consumes less energy than a full operation mode.

When M is less than N, the method may also comprise selecting the M constituent analog-to-digital converters from the array of N constituent analog-to-digital converters. This task may, for example, be performed by a controller associated with the time-interleaved analog-to-digital converter. The selection may be made such that the average time for a constituent analog-to-digital converter in low energy mode is equal for all N constituent analog-to-digital converters. This may be achieved through a round robin selection, a pseudo random selection, or any other uniform selection rule. Alternatively, the selection may be made such that the same (depending on M) constituent analog-to-digital converters are always picked for low energy mode. For example, the low energy mode may be assigned to the N-M constituent analog-to-digital converters that are in one end of the array of a physical hardware implementation.

A second aspect is a computer program product comprising a computer readable medium, having thereon a computer program comprising program instructions. The computer program is loadable into a data-processing unit and adapted to cause execution of the method according to the first aspect when the computer program is run by the data-processing unit.

A third aspect is a time-interleaved analog-to-digital converter for conversion of an analog input signal to a digital output signal having a sample rate R.

The time-interleaved analog-to-digital converter comprises an array of an integer number N of constituent analog-to-digital converters, wherein each constituent analog-to-digital converter has an analog input and a digital output and is adapted to operate based on an analog-to-digital converter operation clock to provide a digital signal at the digital output.

The time-interleaved analog-to-digital converter also comprises an integer number N of sample-and-hold units, wherein each sample-and-hold unit is connected to the analog input of a respective one of the N of constituent analog-to-digital converters and is adapted to operate based on a respective one of a number M of timing signals to provide a sample of the analog input signal at the analog input of the respective constituent analog-to-digital converter, wherein M is less or equal to N. No timing signal is used to clock two or more of the sample-and-hold units.

Furthermore, the time-interleaved analog-to-digital converter comprises one or more digital output processing units adapted to provide a sample of the digital signal of the digital output of the constituent analog-to-digital converter as a sample of the digital output signal based on the respective one of the M timing signals.

The time-interleaved analog-to-digital converter also comprises a timing circuit adapted to generate the analog-to-digital converter operation clock signal and the M timing signals. The analog-to-digital converter operation clock signal has a period that enables a constituent analog-to-digital converter operating based on the analog-to-digital converter operation clock to digitize an analog signal sample during a time period equal to M/R, and each timing signal has a period of M/R.

In some embodiments, the one or more output processing units may comprise a time aligner having N inputs and N outputs, wherein each output of the time aligner is associated with a respective input of the time aligner and each input of the time aligner is connected to the digital output of a respective one of the N of constituent analog-to-digital converters. The time aligner is adapted to, for each of the outputs of the time aligner, transfer the digital output signal from the digital output of the respective constituent analog-to-digital converter to the output of the time aligner via the respective input of the time aligner in response to the time aligner being clocked with the respective one of the M timing signals. The digital output signal of the output of the time aligner has sample rate R/M.

According to some embodiments, the time-interleaved analog-to-digital converter may further comprise a multiplexer adapted to multiplex the digital signals of the outputs of the time aligner to produce the digital output signal.

In some embodiments, the one or more output processing units may comprise a multiplexer adapted to multiplex the digital signals of the digital outputs of the constituent analog-to-digital converters to produce the digital output signal in response to the multiplexer being clocked with the M timing signals and a tagger adapted to provide each sample of the digital output signal with a validation indication.

In some embodiments, the one or more output processing units may comprise a memory adapted to temporarily store samples of the digital signals of the digital outputs of the constituent analog-to-digital converters and a memory output reader adapted to produce the digital output signal in response to being clocked with the M timing signals by reading a corresponding sample stored in the memory.

In some embodiments, M may be equal to N. In other embodiments, M may be less than N.

The time-interleaved analog-to-digital converter may, according to some embodiments comprise a controller. The controller may, for example, be adapted to control an order of activation of the constituent analog-to-digital converters (i.e. a sampling order of the sample-and-hold circuits).

When M is less than N, the controller may be adapted to cause M of the N constituent analog-to-digital converters to operate based on the analog-to-digital converter operation clock to provide the digital signal at the digital output and to cause constituent analog-to-digital converters that are not among the M constituent analog-to-digital converters to enter a low energy mode. In some embodiments, the controller may be further adapted to select the M constituent analog-to-digital converters from the array of N constituent analog-to-digital converters.

A fourth aspect is an integrated circuit comprising the time-interleaved analog-to-digital converter of the third aspect.

A fifth aspect is an electronic device comprising the time-interleaved analog-to-digital converter of the third aspect or the integrated circuit of the fourth aspect.

A sixth aspect is a method of manufacture of a time-interleaved analog-to-digital converter for conversion of an analog input signal to a digital output signal having a sample rate R.

The time-interleaved analog-to-digital converter comprises an array of an integer number N of constituent analog-to-digital converters, wherein each constituent analog-to-digital converter has an analog input and a digital output and is adapted to operate based on an analog-to-digital converter operation clock to provide a digital signal at the digital output with a constituent analog-to-digital converter latency T.

The time-interleaved analog-to-digital converter also comprises an integer number N of sample-and-hold units, wherein each sample-and-hold unit is connected to the analog input of a respective one of the N of constituent analog-to-digital converters and is adapted to operate based on a respective one of a number N of timing signals to provide a sample of the analog input signal at the analog input of the respective constituent analog-to-digital converter. No timing signal is used to clock two or more of the sample-and-hold units.

The time-interleaved analog-to-digital converter further comprises one or more digital output processing units adapted to provide a sample of the digital signal of the digital output of the constituent analog-to-digital converter as a sample of the digital output signal based on the respective one of the M timing signals.

Furthermore, the time-interleaved analog-to-digital converter comprises a timing circuit adapted to generate the analog-to-digital converter operation clock signal and the N timing signals each timing signal having a period of N/R.

The method of manufacture comprises determining an integer M which satisfies T multiplied by R being smaller than or equal to M, and selecting N equal to M. According to some embodiments, the integer M may be determined as the smallest integer that satisfies T multiplied by R being smaller than or equal to M.

In some embodiments, the third, fourth, fifth and sixth aspects may additionally have features identical with or corresponding to any of the various features as explained above for the first aspect.

An advantage of some embodiments is that constituent analog-to-digital converters designed and verified for a fixed clock frequency (or operation rate) may be used in time-interleaved analog-to-digital converters for accommodating various sampling rates. This is achieved by letting the constituent analog-to-digital converters operate based on a clock which does not have to be the same or related to the sampling clock, and time aligning the outputs of the constituent analog-to-digital converters based on the sampling clock.

Another advantage of some embodiments is that the constituent analog-to-digital converters only have to be designed and verified for one clock frequency.

Another advantage of some embodiments is that equidistant sampling may be accomplished.

In some embodiments, the number M of constituent analog-to-digital converters in use is determined based on the current situation and the remaining constituent analog-to-digital converters of an implementation are caused to enter a low energy mode. An advantage with these embodiments is that the time-interleaved analog-to-digital converter is energy efficient.

In some embodiments, the number M of constituent analog-to-digital converters to implement is determined at a design or production phase of the time-interleaved analog-to-digital converter. An advantage of these embodiments is that the time-interleaved analog-to-digital converter is efficient in terms of silicon area.

Yet another advantage of some embodiments is that the number of M of active constituent analog-to-digital converters does not have to be a power of 2, but can be any integer which satisfies the constituent analog-to-digital converter latency T multiplied by the sampling rate R being smaller than or equal to M since the period of the constituent analog-to-digital converters operation clock is not constrained by the sampling rate R.

A further advantage of some embodiments is that the number of M of active constituent analog-to-digital converters does not have to be exactly matched to the sampling rate and the constituent analog-to-digital converter latency. This is achieved by the time alignment of constituent analog-to-digital converter outputs.

Yet a further advantage of some embodiments is that a flexible solution is provided. For example, it may be possible to optimize power consumption for a given sampling rate since any number of constituent analog-to-digital converters may be caused to enter a low energy mode while equidistant sampling may still be provided for.

BRIEF DESCRIPTION OF THE DRAWINGS

Further objects, features and advantages will appear from the following detailed description of embodiments, with reference being made to the accompanying drawings, in which.

DETAILED DESCRIPTION

In the following, embodiments will be described where a time-interleaved analog-to-digital converter (TI ADC) has N processing paths, each comprising a constituent ADC in an array of N constituent ADC:s.

The constituent ADC:s are clocked by an analog-to-digital converter operation clock signal (ADC clock) which typically has a fixed clock period associated with the design and hardware implementation of the constituent ADC:s.

Other parts of the TI ADC (e.g. sample-and-hold units) are clocked based on a sample clock the period of which is typically based on a flexible sample rate. The flexibility may be manifested in the implementation phase in that the number of processing paths is optimized for the sample rate in question, and/or in use in that processing paths that become redundant for a current sample rate may be set to a low energy mode.

The decoupling of the ADC clock from the sampling rate may lead to that output samples from the constituent ADC:s are non-equidistant. The output samples may be properly re-aligned based on the sample clock to produce a resulting digital signal with equidistant samples and the desired sample rate.

Figure 1:
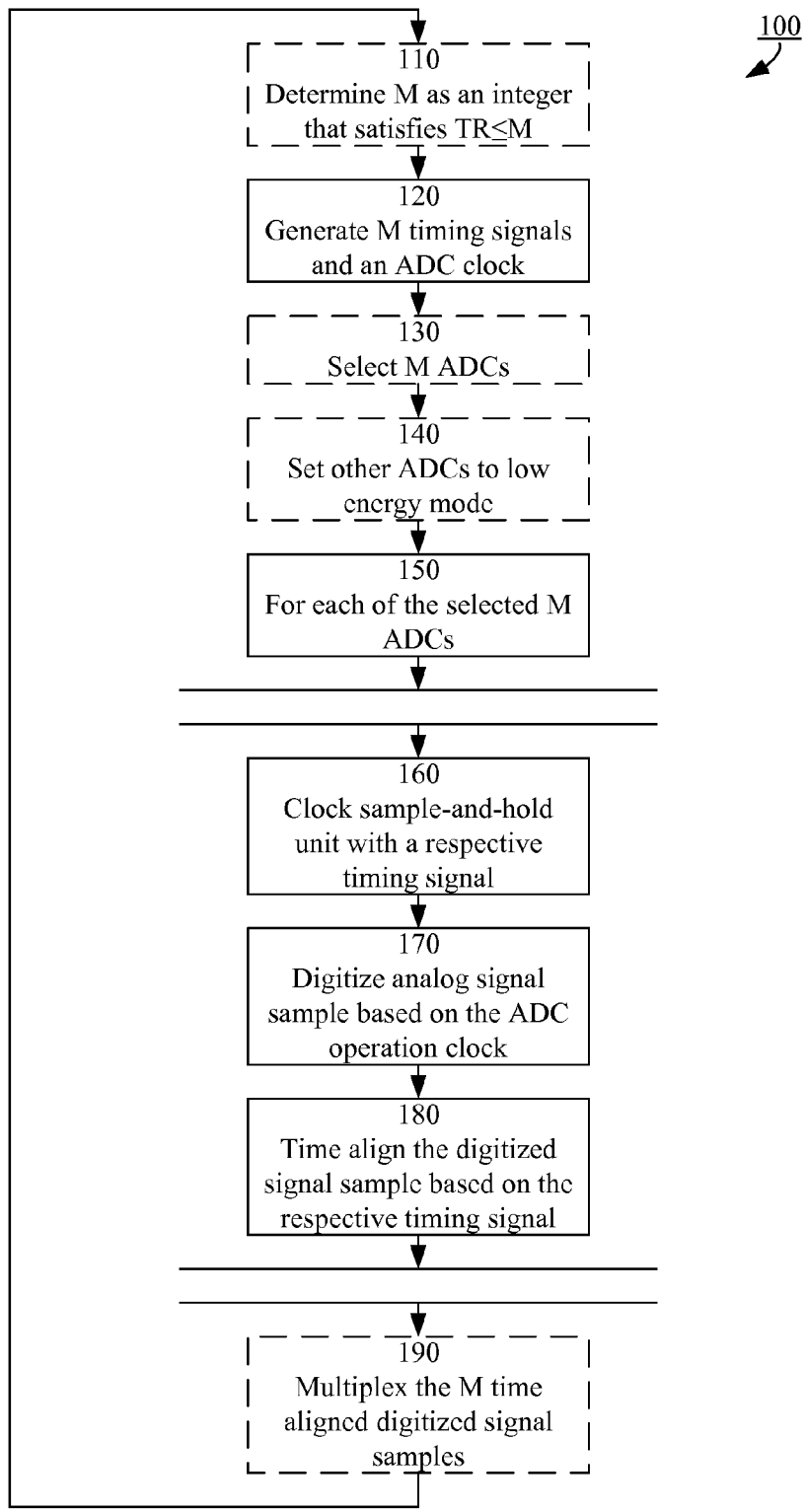
FIG. 1 is a flowchart illustrating example method steps according to some embodiments.

FIG. 1 illustrates an example method 100 of operating a time-interleaved ADC for conversion of an analog input signal to a digital output signal having a sample rate R according to some embodiments. The time-interleaved ADC has an array of N constituent ADC:s, each with a respective sample-and-hold unit connected its analog input. The constituent ADC:s operate based on an analog-to-digital converter operation clock (ADC clock), which is typically fixed and determined by the design and implementation of the constituent ADC:s, and each constituent ADC is capable of digitizing an analog signal sample during a time period equal to T (also referred to as the constituent ADC latency).

The number M of constituent ADC:s to use in a particular execution of the method 100 may be determined in step 110 as an integer that satisfies $TR \leq M$. This condition provides for that a constituent ADC has completed digitizing one analog sample before it has to start digitizing the next analog sample, i.e. in during a time period equal to M/R. For example, M may be determined as the smallest integer that satisfies $TR \leq M$. It may be noted that, since the ADC clock is decoupled from the sampling rate, M does not necessarily have to be a power of 2 but may be flexibly chosen to optimize the efficiency of the TI ADC.

The ADC clock and M timing signals which are time-shifted versions of a clock signal with period M/R are then generated in step 120. The time shift for one of the timing signals may be zero.

In step 130, a selection regarding which M constituent ADC:s among the N constituent ADC:s of the array should be used in the particular execution. In some embodiments, the use of constituent ADC:s may circulate (e.g. in a round-robin fashion) among the N constituent ADC:s of the array. For example, it may be desirable that the utilization of the constituent ADC:s is uniformly distributed over time. The selection may be dynamic or static. In some embodiments, the same constituent ADC:s are always selected for a given M. For example, constituent analog-to-digital converters that are closest to a particular end of the array of a physical hardware implementation may be selected.

If there are any constituent ADC:s that will not be used in the execution (i.e. if M<N) these constituent ADC:s may be caused to enter a low energy mode (or low power mode) in step 140. This may, for example, be achieved by cutting the supply voltage to these constituent ADC:s. Alternatively, these constituent ADC:s may still be operational and may even execute some less power consuming tasks. According to some embodiments, the low energy mode is applied to the entire processing path of a not used constituent ADC.

Steps 160-180 are then executed (in parallel or semi-parallel) for each of the M processing paths corresponding to the selected M constituent ADC:s as indicated by step 150.

The sample-and-hold unit is clocked, in step 160, with one of the M timing signals generated in step 120. Each of the M sample-and-hold units are clocked with a respective one of the M timing signals. Each of the M timing signals is used to clock exactly one sample-and-hold unit and none of the M timing signals is used to clock two or more of the sample-and-hold units. When clocked, the sample-and-hold unit provides a sample of the analog input signal at the analog input of the corresponding constituent ADC.

The constituent ADC digitizes the sample of the analog input signal in step 170. The operations of the constituent ADC are based on the ADC clock generated in step 120.

The digitized sample at the output of the constituent ADC is then aligned with a respective one of the M timing signals in step 180.

This is typically achieved by clocking a time aligner with the same one of the M timing signals as was used in step 160 (although one or more timing signal periods later). The time aligner is then operable to transfer the digitized sample from an input to an output in response to the clocking. The time aligned samples from a processing path are equidistant and have sample rate R/M.

In step 190, the time aligned samples from all M used processing paths are multiplexed to provide a digital output signal with equidistant sampling and sample rate R. The multiplexing order may typically be tied to the clocking of the sample-and-hold units in step 160. Thus, the multiplexer typically chooses the time aligned samples for output in the same order as the sample-and-hold units where clocked. In some embodiments, the clocking is sequential and the multiplexer is a sequencer.

In other embodiments, steps 180 and/or 190 may be replaced by alternative steps that provide the digitized sample at the output of the constituent ADC as a sample of the digital output signal with equidistant sampling and sample rate R.

For example, the digitized samples at the outputs of the constituent ADC:s may be temporarily stored in a memory and the memory may be addressed at the sample rate to provide equidistant sampling of the digital output signal.

In another example, a multiplexer operated at the sample rate (e.g. based on the timing signals) is directly connected to the outputs of the constituent ADC:s and thus outputs a digital output signal with equidistant sampling. In such embodiments, each sample is typically tagged with an indicator that identifies the sample as a valid sample.

According to some embodiments, each sample may be tagged with an indicator that identifies the sample as a valid sample and an indicator defining which constituent ADC generated the sample. In such embodiments, the multiplexing may be performed later, when further processing (such as e.g. digital correction) have been performed.

Figure 2A:
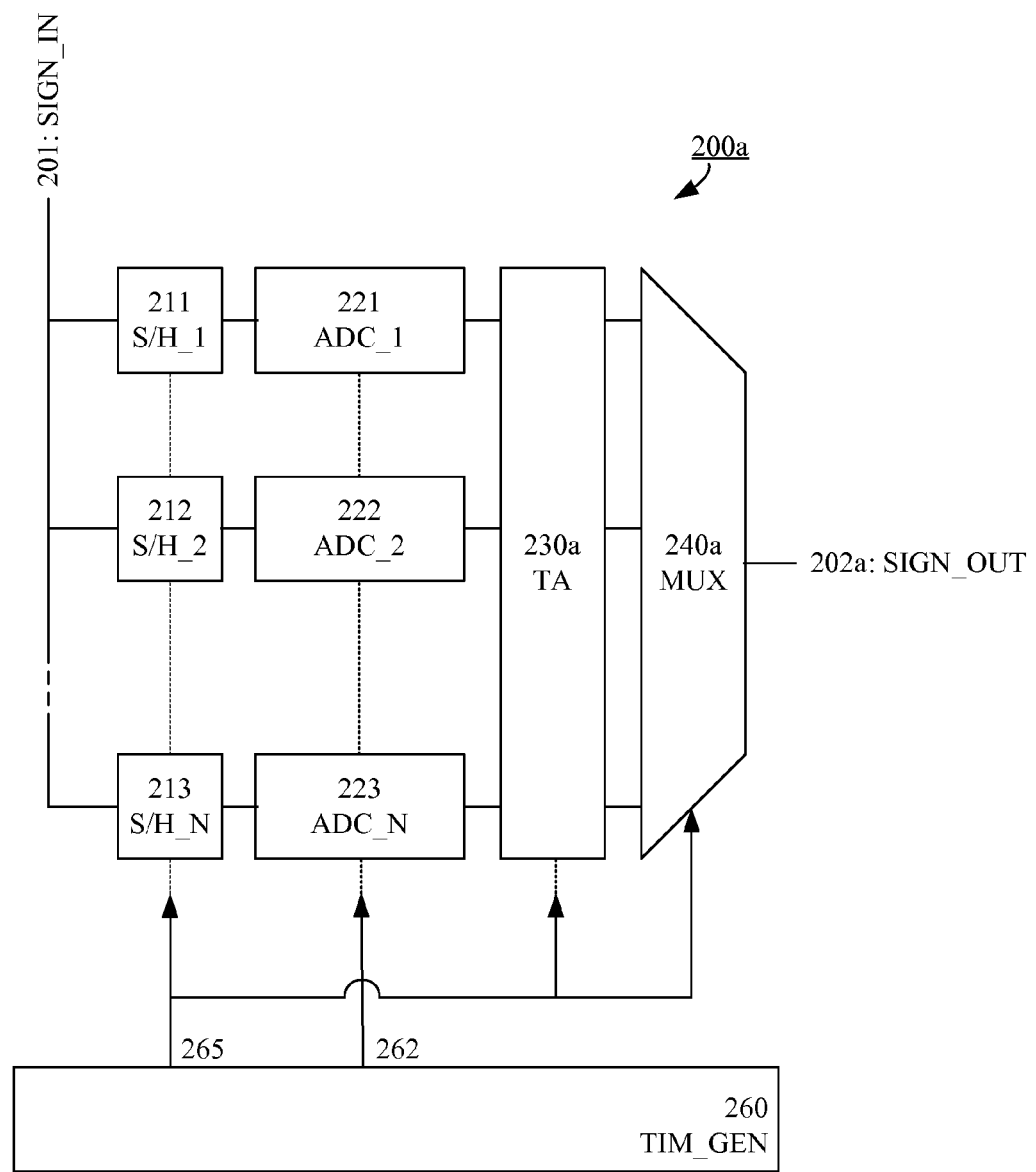
FIG. 2A is a schematic block diagram illustrating an example time-interleaved analog-to-digital converter according to some embodiments.

FIG. 2A illustrates an example time-interleaved analog-to-digital converter (TI ADC) 200a for conversion of an analog input signal (SIGN_IN) to a digital output signal (SIGN_OUT) having a sample rate R according to some embodiments. The TI ADC 200a may, for example, be adapted to perform the method described in connection to FIG. 1.

The TI ADC 200a comprises an array of constituent ADC:s (ADC_1, ADC_2, ..., ADC_N) 221, 222, 223. Each constituent ADC may comprise any suitable known or future ADC implementation. For example, the constituent ADC:s may each comprise a successive approximation ADC such as any of those described in WO 2012/123578 A1 and EP 0624289 B1.

A timing circuit (TIM_GEN) 260 generates an ADC clock 262 and M timing signals 265. The features and conditions of the ADC clock and the timing signals have already been elaborated on above.

The analog input signal (SIGN_IN) is input to the TI ADC 200a at an input 201 and an array of sample-and-hold units (S/H_1, S/H_2, . . . , S/H_N) 211, 212, 213, one for each constituent ADC, are adapted to sample the analog input signal when clocked by a timing signal 265 and provide the analog signal sample at an input of the corresponding constituent ADC 221, 222, 223. In operation, M of the N sample-and-hold units 211, 212, 213 are successively clocked by a respective one of M timing signals as illustrated by 265.

Each of the constituent ADC:s 221, 222, 223 is adapted to operate based on the ADC clock 262 to digitize the analog signal sample at its input. In operation, this task is performed by the M constituent ADC:s that correspond to the successively clocked M sample-and-hold units.

A time aligner (TA) 230a is adapted to receive the digitized signal samples from each of the (in operation M) constituent ADC:s and time align them based on the M timing signals 265. Typically, each output of the time aligner is associated with a respective input of the time aligner and each input of the time aligner is connected to the digital output of a respective one of the N of constituent analog-to-digital converters. When the time aligner is clocked by a timing signal 265 it may transfer (for the processing path comprising the sample-and-hold unit that was clocked by the same timing signal) the digital output signal from the digital output of the constituent analog-to-digital converter to the output of the time aligner via the respective input of the time aligner. For the M processing paths in use, each digital output signal of the time aligner has sample rate R/M.

The TI ADC 200a also comprises a multiplexer (MUX) 240a which appropriately selects and serializes outputs from the time aligner 230a to produce a digital output signal (SIGN_OUT) having a sample rate R at the output 202a of the TI ADC 200a.

By means of control signal 262, the timing circuit 260 is able to provide the ADC clock to each of the constituent ADC:s 221, 222, 223. In operation, the ADC clock is provided to M of the constituent ADC. Further, the ADC clock may or may not be provided to one or more of the remaining N-M constituent ADC:s.

By means of control signal 265, the timing circuit 260 is able to clock each of the N sample-and-hold units 211, 212, 213 with a respective timing signal. In operation, the timing circuit clocks M of the sample-and-hold units with a respective one of M timing signals. The control signal 265 may also be provided to the time aligner 230a and to the multiplexer 240a to control their operation in a similar way as the array of sample-and-hold units are controlled.

Typically, the control signal 265 may comprise a one control signal connection per processing path and the appropriate timing signal may be routed to the appropriate processing path. Alternatively, the control signal 265 may comprise a single control signal connection common for all processing paths. Then, the control signal 265 may be activated at the sample rate R and comprise one of N possible values (e.g. [1, 2, . . . , N]) indicating which processing path the current timing signal refers to. All such variants are intended to be embraced by the formulation "M timing signals each having a period of M/R".

In some embodiments, M may be equal to N, e.g. if the number of constituent ADC:s is optimized to a particular sample rate in a design or production phase, which sample rate is then used in the current execution. Alternatively, M may be less than N, e.g. if the number of constituent ADC:s is chosen based on a maximum sample rate in a design or production phase, and a lower sample rate is then used in the current execution.

Figure 2B:
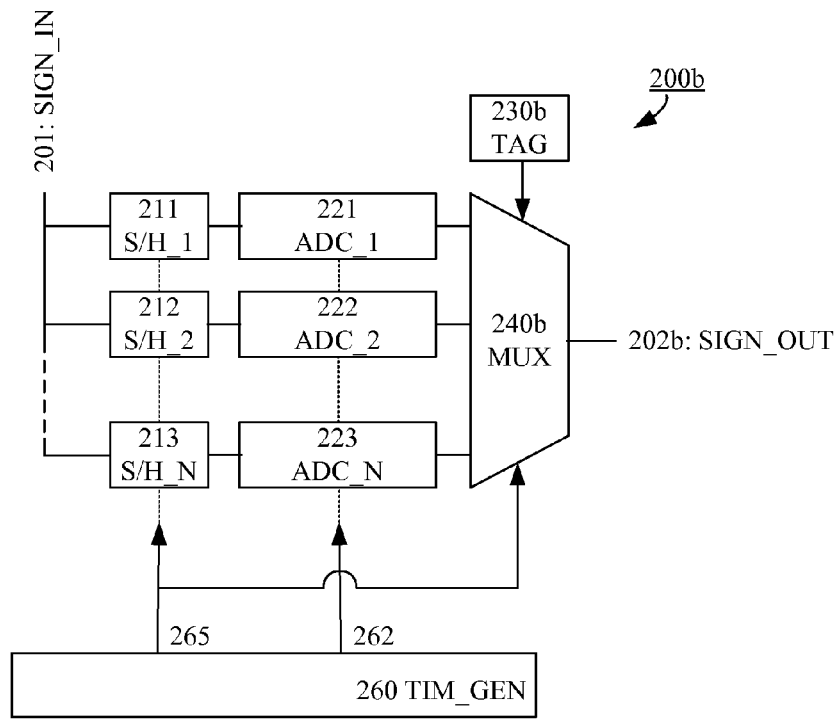
FIG. 2B is a schematic block diagram illustrating an example time-interleaved analog-to-digital converter according to some embodiments.

FIG. 2B illustrates an example time-interleaved analog-to-digital converter (TI ADC) 200b for conversion of an analog input signal (SIGN_IN) to a digital output signal (SIGN_OUT) having a sample rate R according to some embodiments. The TI ADC 200b is in many ways similar to the TI ADC 200a of FIG. 2A. Thus, the corresponding features (201, 211, 212, 213, 221, 222, 223, 260, 262, 265) are denoted with corresponding reference numbers and the will not be described further in relation to FIG. 2B.

The TI ADC 200b illustrates an alternative to the time aligner 230a of FIG. 2A. A multiplexer (MUX) 240b is adapted to (in response to being triggered by the control signal 265) appropriately select and serialize outputs from the constituent ADC:s to produce a digital output signal (SIGN_OUT) having a sample rate R at the output 202b of the TI ADC 200b.

A tagger (TAG) 230b is adapted to provide each sample of the digital output signal with a validation indication that identifies the sample as a valid sample. In the example of FIG. 2B, the tagging is performed in connection to multiplexing by multiplexer 240b. It should be noted, however, that tagging may be performed separately from a multiplexing operation in other embodiments.

Figure 2C:
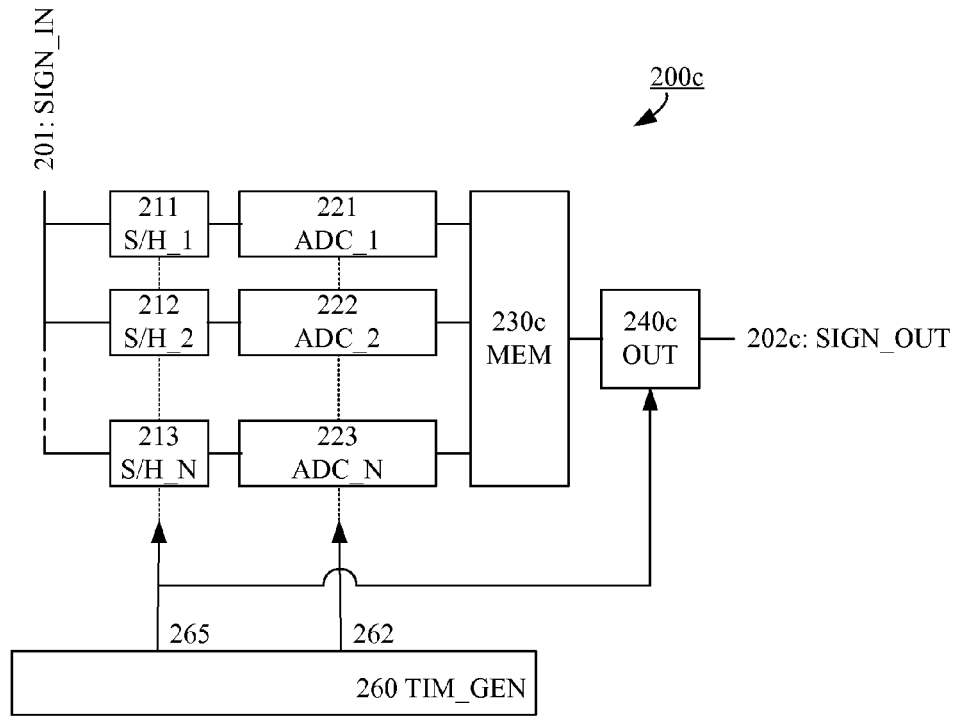
FIG. 2C is a schematic block diagram illustrating an example time-interleaved analog-to-digital converter according to some embodiments.

FIG. 2C illustrates an example time-interleaved analog-to-digital converter (TI ADC) 200c for conversion of an analog input signal (SIGN_IN) to a digital output signal (SIGN_OUT) having a sample rate R according to some embodiments. The TI ADC 200c is in many ways similar to the TI ADC 200a of FIG. 2A. Thus, the corresponding features (201, 211, 212, 213, 221, 222, 223, 260, 262, 265) are denoted with corresponding reference numbers and the will not be described further in relation to FIG. 2C.

The TI ADC 200c illustrates yet an alternative to the time aligner 230a of FIG. 2A. A memory (MEM) 230c is provided to temporarily store outputs from the constituent ADC:s. A memory output reader (OUT) 240c reads a proper item of the memory 230c when triggered by the control signal 265 and thus produces a digital output signal (SIGN_OUT) having a sample rate R at the output 202c of the TI ADC 200c.

Figure 3:
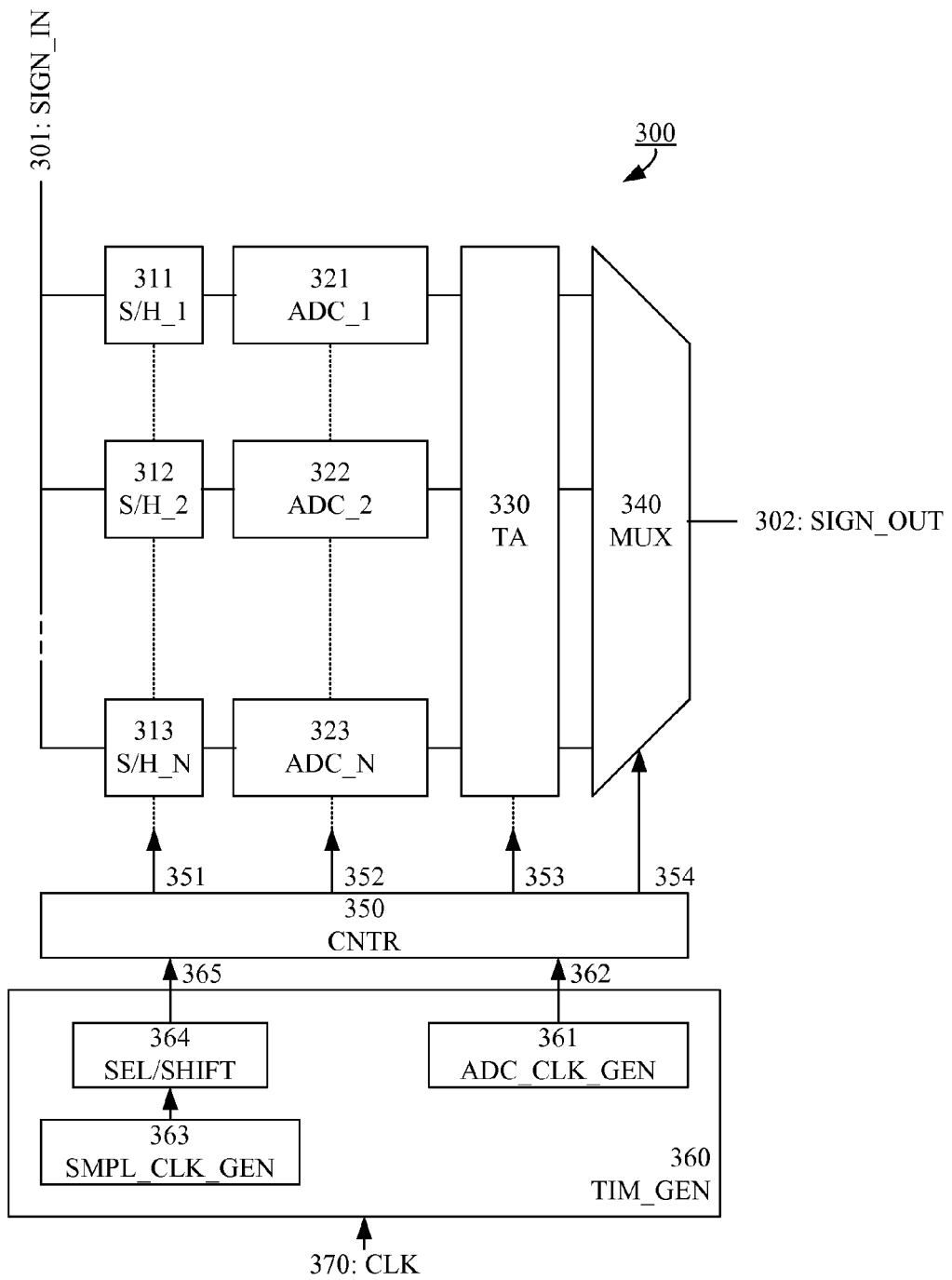
FIG. 3 is a schematic block diagram illustrating an example time-interleaved analog-to-digital converter according to some embodiments.

Using the structure of FIG. 2A as a starting point, FIG. 3 illustrates an example time-interleaved analog-to-digital converter (TI ADC) 300 for conversion of an analog input signal (SIGN_IN) at an input 301 to a digital output signal (SIGN_OUT) at an output 302, which is particularly suitable when the number of constituent ADC:s is chosen based on a maximum sample rate in a design or production phase and variable samples rates are used in execution. Similar modifications may be considered in relation to the structures of FIGS. 2B and 2C respectively. The example TI ADC 300 may, for example, be adapted to perform the method described in connection to FIG. 1.

The functional blocks 311, 312, 313, 321, 322, 323, 330 and 340 are equivalent or similar to the corresponding functional blocks 211, 212, 213, 221, 222, 223, 230a and 240a respectively of FIG. 2A and will therefore not be described in greater detail.

A timing circuit (TIM_GEN) 360 generates an ADC clock 362 and M timing signals 365. One example implementation of the timing circuit 360 is illustrated in FIG. 3, which may also be used to implement the timing circuit 260 of FIGS. 2A, 2B and 2C. It should be noted, however, that any suitable known or future implementation if the timing circuits 260, 360 may be applicable according to embodiments of the invention.

The timing circuit 360 receives a system clock signal (CLK) at an input 370, which is used as a reference for generating the ADC clock 362 and the M timing signals 365.

An ADC clock generator (ADC_CLK_GEN) 361 produces the ADC clock signal. For example, the ADC clock may be equal to the system clock or may have a period which is lesser or greater than the period of the system clock. For example, the ADC clock may have a period that relates to the system clock period such that X periods of the ADC clock equal Y periods of the system clock.

A sample clock generator (SMPL_CLK_GEN) 363 produces the sample clock signal having sample rate R. For example, the sample clock may be equal to the system clock or may have a period which is lesser or greater than the period of the system clock. For example, the sample clock may have a period that relates to the system clock period such that Z periods of the sample clock equal W periods of the system clock.

Thus, according to some embodiments, both the ADC clock and the sample clock may be generated from a system clock signal, e.g. by using different suitable division factors. In other embodiments, the ADC clock and the sample clock may be generated in other ways.

The sample clock signal is used by a timing signal generator (SEL/SHIFT) 364 to produce the M timing signals 365.

In a first example, the timing signal generator 364 produces each of the M timing signals 365 by proper selection of impulses of the sample clock signal.

In a second example, the timing signal generator 364 produces a first one of the timing signals 365 by proper selection of impulses of the sample clock signal and the other timing signals by properly time shifting the first timing signal.

In a third example, the timing signal generator 364 produces a first one of the timing signals 365 by proper division of the sample clock signal and the other timing signals by properly time shifting the first timing signal.

In a fourth example, the timing signal generator 364 output has the sample rate and comprises a selection of M processing path indices (e.g. from the ensemble [1, 2, . . . , N]) at different time shifts.

The TI ADC 300 comprises a controller (CNTR) 350, which receives the ADC clock signal 362 and the M timing signals 365 and controls operation of the functional blocks 311, 312, 313, 321, 322, 323, 330 and 340.

When M is less than N, the controller 350 may cause M of the N constituent ADC:s to operate based on the ADC clock to provide a digital output signal. The controller 350 may also cause constituent ADC:s that are not in use to enter a low energy mode. According to some embodiments, the controller 350 may perform a selection to determine which M of the N processing paths to use in a current execution.

By means of control signal 352, the controller 350 is able to provide the ADC clock to each of the constituent ADC:s 321, 322, 323 and to control the mode (low energy mode or operational mode) of each of the constituent ADC:s.

By means of control signals 351, 353 and 354 the controller 350 is able to clock and otherwise appropriately control each of the N processing paths with a respective timing signal, for example, as has been detailed above.

Functional units described in FIGS. 2A, 2B, 2C and 3 (e.g. the controller 350 and the timing circuits 260, 360) may, of course, have other physical implementation according to other embodiments.

It should be noted that many implementation details that are not vital to the description of the respective embodiments may be omitted in the figures and the corresponding text. For example, additional processing steps (e.g. filtering, amplification, imperfection compensation, etc.) that may be present in each processing path or prior to the provision of the analog signal at the input 201, 301 may be excluded. Such omissions are not intended to exclude any possible presence of such features.

Figure 4:
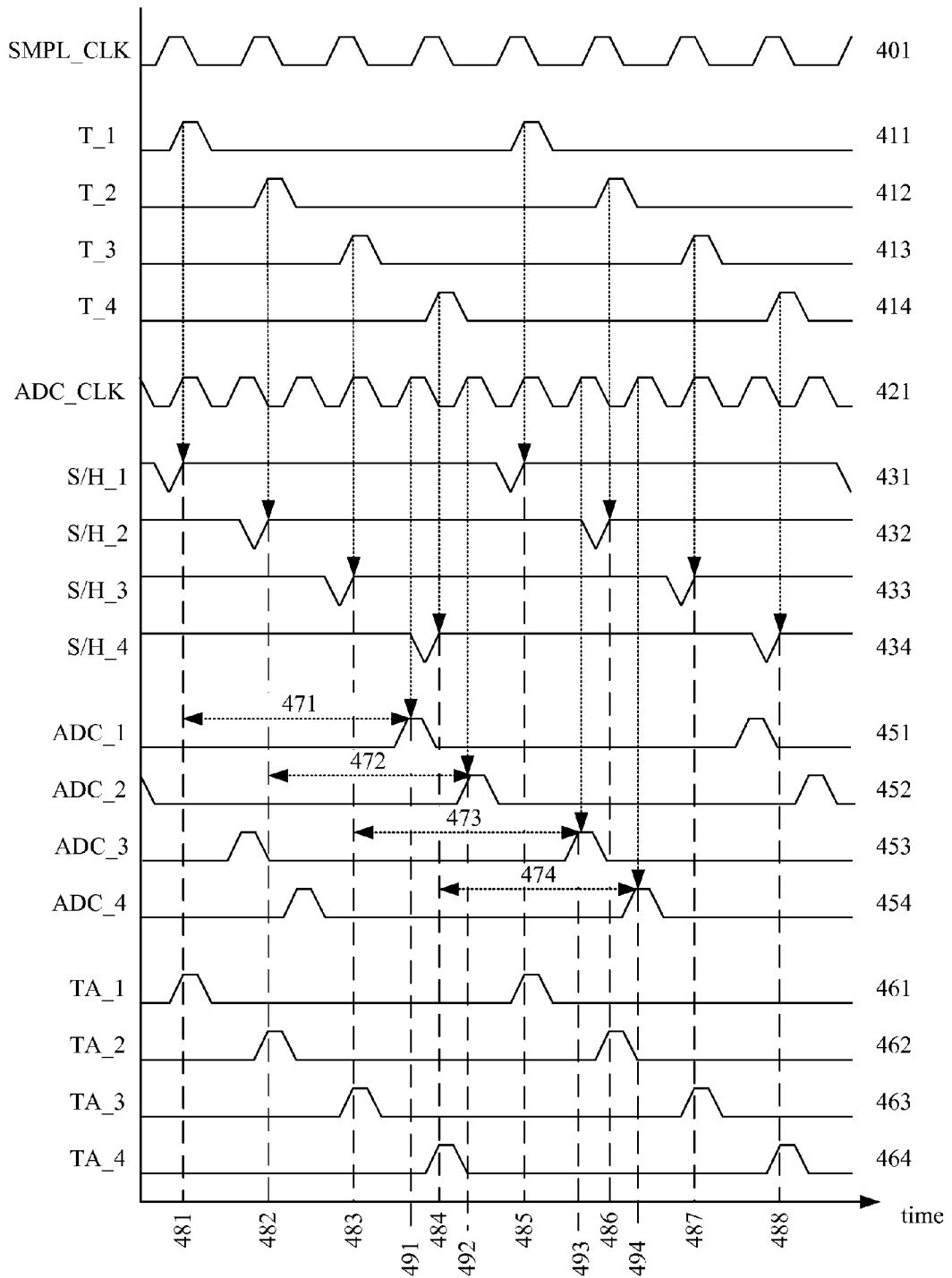
FIG. 4 is a schematic timing diagram illustrating example settings for the constituent analog-to-digital converters according to some embodiments.

FIG. 4 is a schematic timing diagram for an example with M=4 currently used constituent ADC:s. The schematic diagram is particularly aimed to illustrate decoupling of the ADC clock and the sampling clock and how equidistant sampling is achieved by time alignment.

Starting from the top of the timing diagram, a sample clock signal (SMPL_CLK) 401 having rate R, and corresponding M=4 timing signals (T_1, T_2, T_3, T_4) 411, 412, 413, 414 are illustrated. If multiplexed, the M timing signals 411, 412, 413, 414 provide the sample clock signal of rate R. An ADC clock signal (ADC_CLK) 421 is also shown. In this example 6 periods of the ADC clock corresponds to 4 periods of the sample clock signal of rate R.

As illustrated by the sample-and-hold signals (S/H_1, S/H_2, S/H_3, S/H_4) 431, 432, 433, 434, the M=4 sample-and-hold units to be used are clocked by a respective one of the M=4 timing signals (T_1, T_2, T_3, T_4) 411, 412, 413, 414. This is indicated by the dotted arrows from a timing signal 411, 412, 413, 414 to a respective sample-and-hold signal 431, 432, 433, 434 at time instants 481, 482, 483, 484, 485, 486, 487 and 488. The operation of a sample-and-hold unit is depicted, for illustrative purposes only, as a corresponding sample-and-hold signal having a high signal value during the hold-phase and a dip in the signal value in connection to the sampling phase.

In this example, it is assumed that each constituent ADC has a latency of 4 cycles of the ADC clock ADC_CLK 421, i.e. the constituent ADC needs 4 cycles to digitize an analog sample provided by the corresponding sample-and-hold unit, and that the constituent ADC:S are clocked by the positive flanks of the ADC clock. The ADC signals (ADC_1, ADC_2, ADC_3, ADC_4) 451, 452, 452, 454 schematically illustrate when the M=4 constituent ADC:s in use are ready to output a digitized signal sample corresponding to an analog signal sample provided by the sample-and-hold unit.

The first sample-and-hold unit (represented by S/H_1) provides an analog signal sample at time instant 481 and 4 positive flanks (of the ADC clock 421) later, at time instant 491, the first constituent ADC (represented by ADC_1) outputs the corresponding digital sample. Thus, the time between provision of the analog sample and provision of the corresponding digital sample is illustrated by time period 471.

The second sample-and-hold unit (represented by S/H_2) provides an analog signal sample at time instant 482 and 4 positive flanks (of the ADC clock 421) later, at time instant 492, the second constituent ADC (represented by ADC_2) outputs the corresponding digital sample. Thus, the time between provision of the analog and provision of the corresponding digital sample is illustrated by time period 472.

The third sample-and-hold unit (represented by S/H_3) provides an analog signal sample at time instant 483 and 4 positive flanks (of the ADC clock 421) later, at time instant 493, the third constituent ADC (represented by ADC_3) outputs the corresponding digital sample. Thus, the time between provision of the analog and provision of the corresponding digital sample is illustrated by time period 473.

The fourth sample-and-hold unit (represented by S/H_4) provides an analog signal sample at time instant 484 and 4 positive flanks (of the ADC clock 421) later, at time instant 494, the fourth constituent ADC (represented by ADC_4) outputs the corresponding digital sample. Thus, the time between provision of the analog and provision of the corresponding digital sample is illustrated by time period 474.

As illustrated by the time instants 491, 492, 493, 494, the provision of the digital samples by the M=4 constituent ADC:s in use is not equidistant in time. This is due to the fact that the ADC clock is decoupled from the sample clock. The time-aligned signals (TA_1, TA_2, TA_3, TA_4) 461, 462, 462, 464 illustrate how the operations of a time aligner may provide equidistant sampling times even if the ADC clock is decoupled from the sample clock.

The output at time instant 491 of the first constituent ADC is adjusted to time instant 485 as illustrated by time aligned signal TA_1. This may be achieved by clocking the first output of the time aligner with the timing signal T_1. Similarly, the outputs at time instants 492, 493, 494 of the second, third and fourth constituent ADC:s are adjusted to time instants 486, 487, 488 respectively as illustrated by time aligned signals TA_2, TA_3, TA_4. This may be achieved by clocking the respective outputs of the time aligner with the respective timing signals T_2, T_3, T_4.

If the M=4 time aligned digital samples represented by TA_1, TA_2, TA_3, TA_4 are multiplexed, a digital output signal with sample rate R and equidistant sampling is provided.

Embodiments of the invention may be combined with applications where imperfection measurements, calibration and compensation are practiced. For example, if M<N, one or more of the N-M processing paths not currently in use for digitizing the analog input signal may be subject to imperfection measurements, the results of which may be used later for calibration and compensation.

The imperfection measurements may be realized by letting the analog input to a constituent ADC of the processing path to be measured receive a reference signal value instead of the analog input signal during that activation of the array of constituent ADC:s. The reference value may be a ground level or a zero level (e.g. 0 V) in which case it is typically assumed that the imperfection is linear (i.e. that the imperfection is independent of the input signal value). Alternatively, the reference value may be a non-zero level. One example of how a non-zero level may be used to calibrate a constituent ADC is disclosed in WO 2012/123578 A1. Yet alternatively, the reference value may vary among a number of different reference levels (suitable for performing different types of imperfection measurements) between different measurement occasions. In some embodiments, the reference value is a varying signal, which enables measuring and compensating for sampling time imperfections and frequency drift.

The reference value may be input to the constituent ADC by operation of a switch at the input of the constituent ADC. Alternatively, the reference value may be set as input to the constituent ADC by earlier processing steps.

The described embodiments and their equivalents may be realized in software or hardware or a combination thereof. They may be performed by general-purpose circuits associated with or integral to a communication device, such as digital signal processors (DSP), central processing units (CPU), co-processor units, field-programmable gate arrays (FPGA) or other programmable hardware, or by specialized circuits such as for example application-specific integrated circuits (ASIC). All such forms are contemplated to be within the scope of this disclosure.

Embodiments may appear within an electronic apparatus comprising circuitry/logic or performing methods according to any of the embodiments. The electronic apparatus may, for example, be an analog front-end, a communication device, a multimedia device, an audio/video recorder, etc. For example, a video processor may comprise three TI ADC:s (e.g. such as any of those described in FIGS. 2A, 2B, 2C and 3), one for each channel (RGB—red, green, blue).

Figure 5:
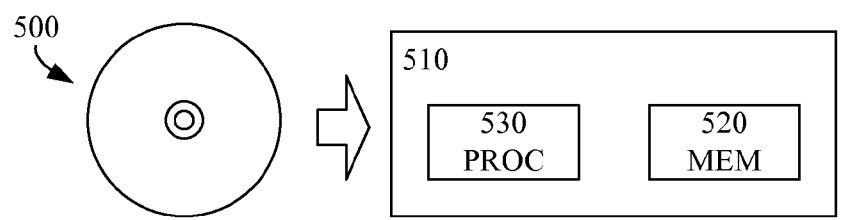
FIG. 5 is a schematic drawing illustrating a computer readable medium according to some embodiments.

According to some embodiments, a computer program product comprises a computer readable medium such as, for example, a diskette or a CD-ROM as illustrated by the CD-ROM 500 of FIG. 5. The computer readable medium may have stored thereon a computer program comprising program instructions. The computer program may be loadable into a data-processing unit 530, which may, for example, be comprised in a device 510. When loaded into the data-processing unit 530, the computer program may be stored in a memory 520 associated with or integral to the data-processing unit 630. According to some embodiments, the computer program may, when loaded into and run by the data-processing unit, cause the data-processing unit to execute method steps according to, for example, the method shown in FIG. 1.

Reference has been made herein to various embodiments. However, a person skilled in the art would recognize numerous variations to the described embodiments that would still fall within the scope of the claims. For example, the method embodiments described herein describes example methods through method steps being performed in a certain order. However, it is recognized that these sequences of events may take place in another order without departing from the scope of the claims. Furthermore, some method steps may be performed in parallel even though they have been described as being performed in sequence and vice versa.

In the same manner, it should be noted that in the description of embodiments, the partition of functional blocks into particular units is by no means limiting. Contrarily, these partitions are merely examples. Functional blocks described herein as one unit may be split into two or more units. In the same manner, functional blocks that are described herein as being implemented as two or more units may be implemented as a single unit without departing from the scope of the claims. For example, the controller 350 of FIG. 3 may be implemented as several units and/or the timing circuits 260, 360 of FIGS. 2A, 2B, 2C and 3 may be implemented as several units (e.g. one generating the ADC clock and one generating the M timing signals). To mention another example, the time aligner 230*a*, 330 of FIGS. 2A and 3 may be implemented as one unit per processing path.

Hence, it should be understood that the details of the described embodiments are merely for illustrative purpose and by no means limiting. Instead, all variations that fall within the range of the claims are intended to be embraced therein.

The invention claimed is:

1. A method of operating a time-interleaved analog-to-digital converter for conversion of an analog input signal to a digital output signal having a variable sample rate R, wherein the time-interleaved analog-to-digital converter comprises:
    an array of an integer number N of constituent analog-to-digital converters each having an analog input and a digital output, wherein each constituent analog-to-digital converter is adapted to operate based on an analog-to-digital converter operational clock with fixed clock frequency which is not constrained by the variable sampling rate R, and to digitize an analog signal sample during a constituent analog-to-digital converter latency T;

an integer number N of sample-and-hold units, each sample-and-hold unit connected to the analog input of a respective one of the N of constituent analog-to-digital converters; and a timing circuit for generating:
the analog-to-digital converter operation clock signal; and
an integer number M of timing signals each timing signal having a period of M/R, wherein M is less or equal to N, and wherein M/R is larger than or equal to T;

the method comprising, for each of a number M of the N constituent analog-to-digital converters, wherein each of the M constituent analog-to-digital converters is associated with a corresponding sample-and-hold unit:

clocking the corresponding sample-and-hold unit with a respective one of the M timing signals to provide a sample of the analog input signal at the analog input of the constituent analog-to-digital converter, wherein no timing signal is used to clock two or more of the sample-and-hold units;

operating the constituent analog-to-digital converter based on the analog-to-digital converter operation clock to provide a digital signal at the digital output of the constituent analog-to-digital converter; and providing a sample of the digital signal of the digital output of the constituent analog-to-digital converter as a sample of the digital output signal based on the respective one of the M timing signals by aligning the sample with the respective one of the M timing signals.

2. The method of claim 1 wherein the time-interleaved analog-to-digital converter comprises a time aligner having N inputs and N outputs, wherein each output is associated with a respective input and each input is connected to the digital output of a respective one of the N of constituent analog-to-digital converters, and wherein providing the sample of the digital signal of the digital output of the constituent analog-to-digital converter as a sample of the digital output signal based on the respective one of the M timing signals comprises:

clocking the time aligner with the respective one of the M timing signals; and transferring, in response to clocking the time aligner with the respective one of the M timing signals, the digital signal from the digital output of the constituent analog-to-digital converter to a corresponding output of the time aligner via a corresponding input of the time aligner, wherein the digital signal of the corresponding output of the time aligner has sample rate R/M.

3. The method of claim 2 further comprising multiplexing the digital signals of the corresponding outputs of the time aligner to produce the digital output signal.

4. The method of claim 3, wherein the integer M is determined as the smallest integer that satisfies T multiplied by R being smaller than or equal to M.

5. The method of claim 1 wherein M is less than N, the method further causing constituent analog-to-digital converters that are not among the M constituent analog-to-digital converters to enter a low energy mode.

6. The method of claim 5 further comprising selecting the M constituent analog-to-digital converters from the array of N constituent analog-to-digital converters.

7. A computer program product comprising a computer readable medium, having thereon a computer program comprising program instructions, the computer program being loadable into a data-processing unit (530) and adapted to cause execution of the method according to claim 1 when the computer program is run by the data-processing unit.

8. A time-interleaved analog-to-digital converter for conversion of an analog input signal to a digital output signal having a variable sample rate R, the time-interleaved analog-to-digital converter comprising:

an array of an integer number N of constituent analog-to-digital converters, wherein each constituent analog-to-digital converter has an analog input and a digital output and is adapted to operate based on an analog-to-digital converter operation clock with fixed clock frequency which is not constrained by the variable sampling rate R, and to digitize an analog signal sample during a constituent analog-to-digital converter latency T to provide a digital signal at the digital output;

an integer number N of sample-and-hold units, wherein each sample-and-hold unit is connected to the analog input of a respective one of the N of constituent analog-to-digital converters and is adapted to operate based on a respective one of an integer number M of timing signals to provide a sample of the analog input signal at the analog input of the respective constituent analog-to-digital converter, wherein no timing signal is used to clock two or more of the sample-and-hold units;

one or more digital output processing units adapted to provide a sample of the digital signal of the digital output of the constituent analog-to-digital converter as a sample of the digital output signal based on the respective one of the M timing signals by aligning the sample with the respective one of the M timing signals; and a timing circuit adapted to generate:
the analog-to-digital converter operation clock signal; and
the M timing signals each timing signal having a period of M/R, wherein M is less or equal to N and wherein M/R is larger than or equal to T.

9. The time-interleaved analog-to-digital converter of claim 8, wherein the one or more digital output processing units comprise a time aligner having N inputs and N outputs, wherein each output of the time aligner is associated with a respective input of the time aligner and each input of the time aligner is connected to the digital output of a respective one of the N of constituent analog-to-digital converters, the time aligner being adapted to, for each of the outputs of the time aligner, transfer the digital signal from the digital output of the respective constituent analog-to-digital converter to the output of the time aligner via the respective input of the time aligner in response to the time aligner being clocked with the respective one of the M timing signals, wherein the digital signal of the output of the time aligner has sample rate R/M.

10. The time-interleaved analog-to-digital converter of claim 9 wherein the one or more digital output processing units further comprises a multiplexer adapted to multiplex the digital signals of the outputs of the time aligner to produce the digital output signal.

11. The time-interleaved analog-to-digital converter of claim 8 wherein M equal to N.

12. The time-interleaved analog-to-digital converter of claim 8 wherein M is less than N, the time-interleaved analog-to-digital converter further comprising a controller adapted to cause M of the N constituent analog-to-digital converters to operate based on the analog-to-digital converter operation clock to provide the digital signal at the digital output and to cause constituent analog-to-digital converters that are not among the M constituent analog-to-digital converters to enter a low energy mode.

13. The time-interleaved analog-to-digital converter of claim 12, wherein the controller is further adapted to select the M constituent analog-to-digital converters from the array of N constituent analog-to-digital converters.

14. An integrated circuit comprising the time-interleaved analog-to-digital converter of claim 8.

15. An electronic device comprising the time-interleaved analog-to-digital converter of claim 8.

16. An electronic device comprising the integrated circuit of claim 14.

* * * * *